(12) United States Patent
Gandhi et al.

(10) Patent No.: US 9,941,190 B2
(45) Date of Patent: Apr. 10, 2018

(54) SEMICONDUCTOR DEVICE HAVING THROUGH-SILICON-VIA AND METHODS OF FORMING THE SAME

(71) Applicant: Micron Technology, Inc., Boise, ID (US)

(72) Inventors: Jaspreet S. Gandhi, Boise, ID (US); Wayne H. Huang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 17 days.

(21) Appl. No.: 14/678,085

(22) Filed: Apr. 3, 2015

(65) Prior Publication Data

US 2016/0293519 A1    Oct. 6, 2016

(51) Int. Cl.
  *H01L 23/48* (2006.01)
  *H01L 23/52* (2006.01)
  (Continued)

(52) U.S. Cl.
  CPC ........ *H01L 23/481* (2013.01); *H01L 21/6835* (2013.01); *H01L 21/76898* (2013.01); *H01L 24/05* (2013.01); *H01L 24/13* (2013.01); *H01L 21/6836* (2013.01); *H01L 24/03* (2013.01); *H01L 24/11* (2013.01); *H01L 24/16* (2013.01); *H01L 24/32* (2013.01); *H01L 2221/6834* (2013.01); *H01L 2221/68327* (2013.01); *H01L 2224/02125* (2013.01); *H01L 2224/0346* (2013.01); *H01L 2224/0401* (2013.01); *H01L 2224/05559* (2013.01); *H01L 2224/05567* (2013.01); *H01L 2224/05644* (2013.01); *H01L 2224/05647* (2013.01); *H01L 2224/05655* (2013.01); *H01L 2224/05666* (2013.01); *H01L 2224/05671* (2013.01); *H01L 2224/05684* (2013.01); *H01L 2224/10125* (2013.01); *H01L 2224/1146* (2013.01); *H01L 2224/13006* (2013.01); *H01L 2224/13022* (2013.01);
  (Continued)

(58) Field of Classification Search
  CPC ............ H01L 23/481; H01L 21/76898; H01L 2224/05552; H01L 2224/0557; H01L 2224/13025; H01L 2224/05025; H01L 2224/05571; H01L 2224/13009; H01L 2224/16146; H01L 2224/16147; H01L 2225/06541; H01L 23/5384; H01L 2224/02372
  USPC ......... 257/774, 621, 737, E23.011, E21.597; 438/667, 637, 613
  See application file for complete search history.

(56) References Cited

U.S. PATENT DOCUMENTS 8,956,966 B2   2/2015  Lin et al.
8,977,806 B1   3/2015  Rosenband et al.
(Continued)

*Primary Examiner* — Fernando L Toledo
*Assistant Examiner* — Aaron Gray
(74) *Attorney, Agent, or Firm* — Brooks, Cameron & Huebsch, PLLC

(57) ABSTRACT

Semiconductor devices having a through-silicon-via and methods of forming the same are described herein. As an example, a semiconductor device may include a substrate material, a through-silicon-via protrusion extending from the substrate material, a first dielectric material formed on the substrate material, a second dielectric material formed on the first dielectric material, and an interconnect formed on the through-silicon-via protrusion, where the interconnect formed is in an opening in the second dielectric material.

11 Claims, 11 Drawing Sheets

(51) Int. Cl.
  *H01L 29/40* (2006.01)
  *H01L 21/4763* (2006.01)
  *H01L 21/44* (2006.01)
  *H01L 21/768* (2006.01)
  *H01L 21/683* (2006.01)
  *H01L 23/00* (2006.01)
(52) U.S. Cl.
  CPC ........... *H01L 2224/13025* (2013.01); *H01L 2224/13144* (2013.01); *H01L 2224/13147* (2013.01); *H01L 2224/13155* (2013.01); *H01L 2224/13166* (2013.01); *H01L 2224/13171* (2013.01); *H01L 2224/13184* (2013.01); *H01L 2224/16145* (2013.01); *H01L 2224/16227* (2013.01); *H01L 2224/32145* (2013.01); *H01L 2224/73204* (2013.01); *H01L 2924/15311* (2013.01); *H01L 2924/16195* (2013.01)

(56) References Cited

U.S. PATENT DOCUMENTS

| | | | |
|---|---|---|---|
| 8,987,131 B2 | 3/2015 | Sakuma | |
| 2010/0140805 A1* | 6/2010 | Chang | H01L 21/6835 257/773 |
| 2013/0200525 A1* | 8/2013 | Lee | H01L 23/481 257/774 |
| 2013/0256910 A1* | 10/2013 | Lee | H01L 21/76802 257/774 |
| 2015/0017798 A1 | 1/2015 | Zhang | |
| 2015/0035168 A1 | 2/2015 | Tezcan et al. | |
| 2015/0333014 A1* | 11/2015 | Wirz | H01L 21/0274 257/774 |
| 2016/0155686 A1* | 6/2016 | Lee | H01L 23/481 257/737 |

* cited by examiner

SEMICONDUCTOR DEVICE HAVING THROUGH-SILICON-VIA AND METHODS OF FORMING THE SAME

TECHNICAL FIELD

The present disclosure relates generally to semiconductor devices and methods, and more particularly to semiconductor devices having a through-silicon-via and methods of forming the same.

BACKGROUND

Semiconductor devices can be used in a variety of electronic applications, such as personal computers, cell phones, digital cameras, and other electronic devices. Various semiconductor devices, e.g., memory dies, utilize through-silicon-vias (TSVs), which are conductive vias that can provide electrical continuity through a semiconductor device, such as a silicon wafer or die, for instance. TSVs can enable two or more integrated circuit (IC) devices to be stacked vertically into a three-dimensional (3D) chip stack. For example, the TSVs of an IC device at a top of a stack can connect to the TSVs of an IC device lower in the stack. By electrically connecting the IC devices in a stack, the TSVs can enable the IC devices in the stack to function as a single device, for example. TSV technology can enable a 3D chip stack to have increased connectivity, bandwidth, and/or functionality, yet occupy a small footprint area, among other benefits.

DETAILED DESCRIPTION

Figure 1A:
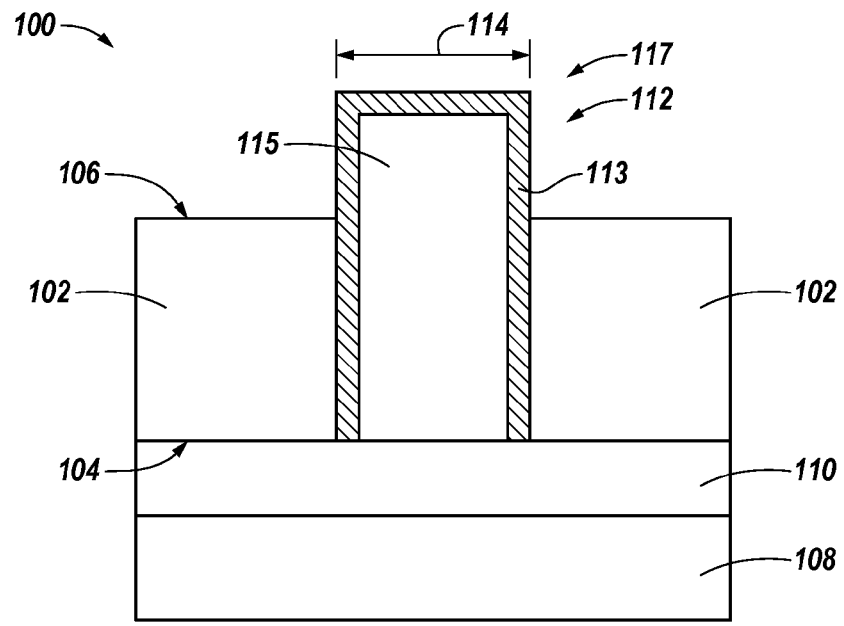
FIGS. 1A-1F illustrate various process stages associated with forming a semiconductor device in accordance with a number of embodiments of the present disclosure.

Semiconductor devices having a through-silicon-via (TSV) and methods of forming the same are described herein. For instance a semiconductor device can include a substrate material, a through-silicon-via protrusion extending from the substrate material, a first dielectric material formed on the substrate material, a second dielectric material formed on the first dielectric material, and an interconnect formed on the through-silicon-via protrusion, wherein the interconnect is formed in an opening in the second dielectric material. Various embodiments of the present disclosures provide that a semiconductor device can include a through-silicon-via providing a conductive path between opposing sides of a semiconductor die, an interconnect formed on an exposed surface of the through-silicon-via, the exposed surface providing a first conductive contact surface for the interconnect, a number of conductive plugs providing a respective number of additional conductive contact surfaces for the interconnect, for instance.

TSVs may be formed in semiconductor devices by a variety of processes. As an example, a photoresist can be applied to a surface, e.g. frontside surface of a semiconductor wafer. Thereafter, the wafer can be patterned and an etching process, such as a deep reactive-ion etching process, can be utilized to create vias in the patterned wafer. The wafer, which may be referred to as a substrate, can include a number of semiconductor based structures that can include silicon, silicon-on-insulator (SOI), silicon-on-sapphire, silicon germanium, gallium-arsenide, among others. For various applications, a number of materials may be formed in the vias. For instance, a liner material, such as an oxide, and a barrier material, such as a tantalum for instance, can be formed in the vias. The vias can be filled with a conductive material, such as copper, tungsten, or aluminum, for instance. At this stage the filled vias may not extend completely through the wafer. As such, the wafer can be flipped and backside processing can occur. For instance, a thinning and/or TSV reveal process can be performed resulting in the conductive material within the vias extending all the way through the wafer.

After formation of the TSVs, e.g., after the vias extend through the wafer, a number of further processing steps can be performed for various applications. For instance, an interconnect, such as an under bump metallization (UBM) and/or a pillar, can be formed on a TSV in order to facilitate connection, e.g., physical and/or electrical, of the semiconductor device to a number of other semiconductor devices and/or other components of an electronic device.

After formation of the interconnect, a singulation process can occur, in which a wafer can be cut to form a number of singulated semiconductor devices, e.g., dies. This process can include adhering the wafer to dicing tape prior to singulation. However, removing the singulated dies from the dicing tape can cause issues die to adhesion of the backside interconnects to the dicing tape, for instance, because the dicing tape has adhesive characteristics an interconnect may adhere to the dicing tape. As an example, interconnects can inadvertently be displaced, e.g., an interconnect may be torn from a TSV, when the singulated semiconductor devices are removed from the dicing tape. Advantageously, embodiments of the present disclosure can provide benefits such as reducing instances of inadvertent displacement of interconnects from underlying TSVs. That is, semiconductor devices of the present disclosure include improved adhesion between TSVs and interconnects, as compared to other semiconductor devices, among other benefits.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 112 may reference element "12" in FIG. 1, and a similar element may be referenced as 212 in FIG. 2. Also, as used herein, "a number of" a particular element and/or feature can refer to one or more of such elements and/or features.

FIGS. 1A-1F illustrate various process stages associated with forming a semiconductor device in accordance with a number of embodiments of the present disclosure. FIG. 1A illustrates a cross-sectional view of a portion of a semiconductor device 100 in accordance with a number of embodiments of the present disclosure.

The semiconductor device 100 shown in FIG. 1A includes a TSV 112 formed in a substrate 102. In this example, a first face 104, e.g., front side, of the substrate 102 is adhered to a carrier wafer 108 via a temporary adhesive 110, e.g., a glue material. Although not shown in FIG. 1A, circuitry may be located between the adhesive 110 and coupled to the TSV 112. The substrate 102 can include a semiconductor material, such as silicon; however, embodiments are not limited to a particular substrate material or materials.

As illustrated in FIG. 1A, the TSV 112 extends through the substrate 102, e.g., from the first face 104 to a second face 106, which can be referred to as a backside of the substrate 102. FIG. 1A illustrates device 100 subsequent to a reveal process in which a portion of the substrate material 102 has been removed, e.g., via an etch process, to expose a TSV protrusion 117. While FIG. 1A illustrates a single TSV 112, embodiments of the present disclosure are not so limited. For instance, the semiconductor device 100 can include a plurality of TSVs formed in substrate material 102 and arranged in an array configuration, for example.

In this example, the TSV 112 includes a liner material 113 on a conductive core material 115. The liner material 113 can include a number of materials. As an example, the liner material 113 can include an outer dielectric material, e.g., an oxide barrier material such as SiO (silicon oxide), and an inner conductive material, e.g., a conductive seed material such as Ta (tantalum). However, embodiments are not limited to a particular liner material(s) 113. The core material 115 is a conductive material such as copper, tungsten, and aluminum, and/or combinations thereof, among various other conductive materials. The TSV 112 can provide a conductive path between opposing sides 104/106 of the semiconductor device 100. A diameter 114 of the TSV 112 can be in a range of about 3 microns to about 15 microns, for instance. However, embodiments of the present disclosure are not limited to TSVs having a particular diameter. As the diameter 114 of a TSV 112 decreases, there can be an increased likelihood of separation, e.g., detachment or "tear off", between the TSV and an interconnect formed thereon, e.g., during die removal from dicing tape. As described further herein, a number of embodiments of the present disclosure can provide increased adhesion between the TSVs 112 and interconnects, which can reduce the likelihood of such separation even as the diameter 114 of a TSV 112 decreases.

Figure 1B:
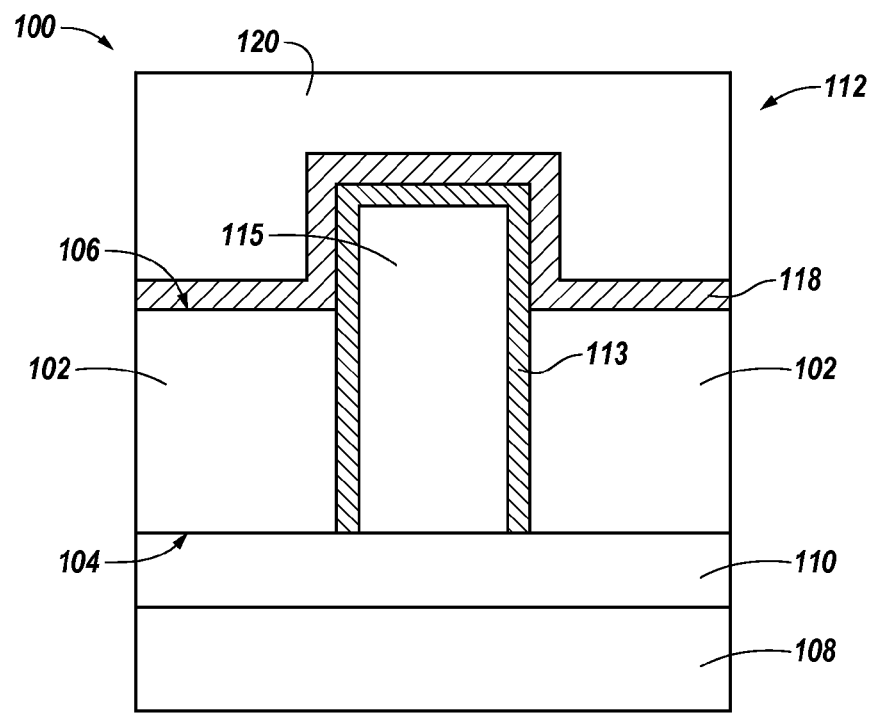

FIG. 1B illustrates the semiconductor device 100 of FIG. 1A at a subsequent processing stage. The example shown in FIG. 1B illustrates the device 100 during a passivation process. In this example, the passivation process includes forming a first dielectric material 118 on the substrate 102 and TSV protrusion 117, and forming a second dielectric material 120 on the first dielectric material 118. As used herein, forming a first material on a second material can, but need not, refer to direct contact between the two materials. As an example, the first dielectric material 118 can be a nitride, e.g., silicon nitride, and the second dielectric material 120 can be an oxide material, e.g., silicon oxide; however, embodiments are not so limited.

Figure 1C:
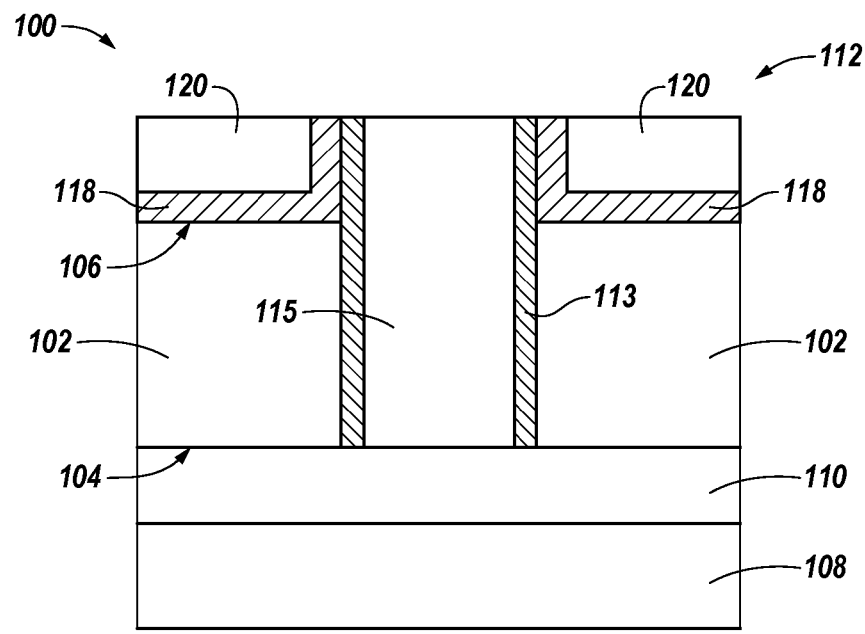

FIG. 1C illustrates the semiconductor device 100 of FIG. 1B at a subsequent processing stage. A planarization process, e.g., CMP, has been performed to expose a portion of the TSV 112. In this example, the CMP process removes a portion of the first dielectric material 118, a portion of the second dielectric material 120, and a portion of the liner material 113 on TSV protrusion 117. The exposed surface 121, e.g., an end surface, of the TSV protrusion 117 subsequent to planarization process is shown in FIG. 1C.

Figure 1D:
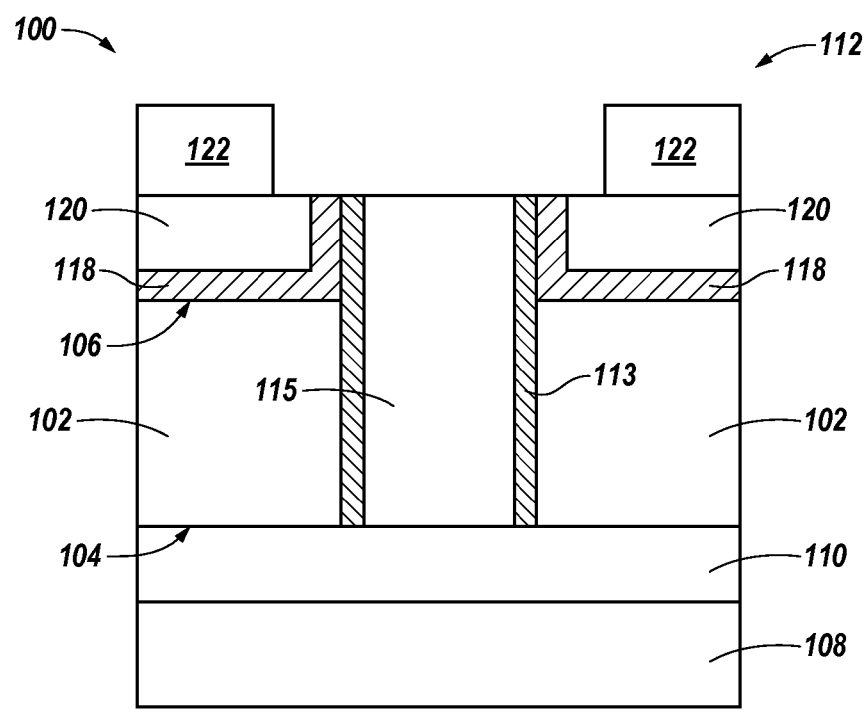

FIG. 1D illustrates the semiconductor device 100 of FIG. 1C at a subsequent processing stage. A photoresist material 122 can be formed on the planarized surface of the semiconductor device 100 and developed as shown in FIG. 1D.

Figure 1E:
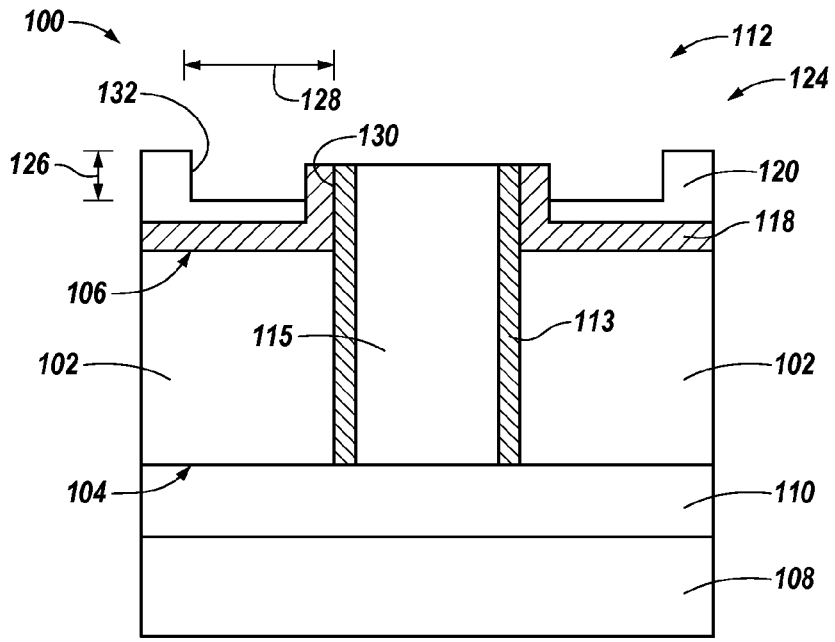

FIG. 1E illustrates the semiconductor device 100 of FIG. 1D at a subsequent processing stage. As illustrated in FIG. 1E, an opening 124 can be formed in the dielectric material 120, e.g., by one or more etching processes. The opening 124 may comprise a recess in the dielectric material 120. For instance, the opening 124 may be defined by surfaces of the dielectric material 120. Forming the opening 124 can include removing at least a portion of the dielectric material 118 formed on the sidewalls of the TSV protrusion 117 As an example, the opening 124 can have a depth 126 of 0.25 microns to 5 microns; however, embodiments are not so limited. The opening 124 can have a depth 126 that is about 35 percent to 85 percent of a depth of the dielectric material 120, e.g., a linear distance between a lower surface 119 defining the opening 124 and an upper surface 123 of the dielectric material 120. A distance 128 between a sidewall 132 of the opening 124 and an exposed sidewall 130 of the TSV 112 can be 1 micron to 20 microns, for instance.

As shown in FIG. 1E, in a number of embodiments, the lower surface 119 of the opening extends below an exposed end surface 121 of the TSV protrusion 117. That is, the end surface 121 of the exposed portion of the TSV protrusion 117 can be located between the lower surface 119 of the opening 124 and the upper surface 123 of the dielectric material 120. FIG. 1E also illustrates the photoresist material 122 as having been removed from the surface of device 100.

Figure 1F:
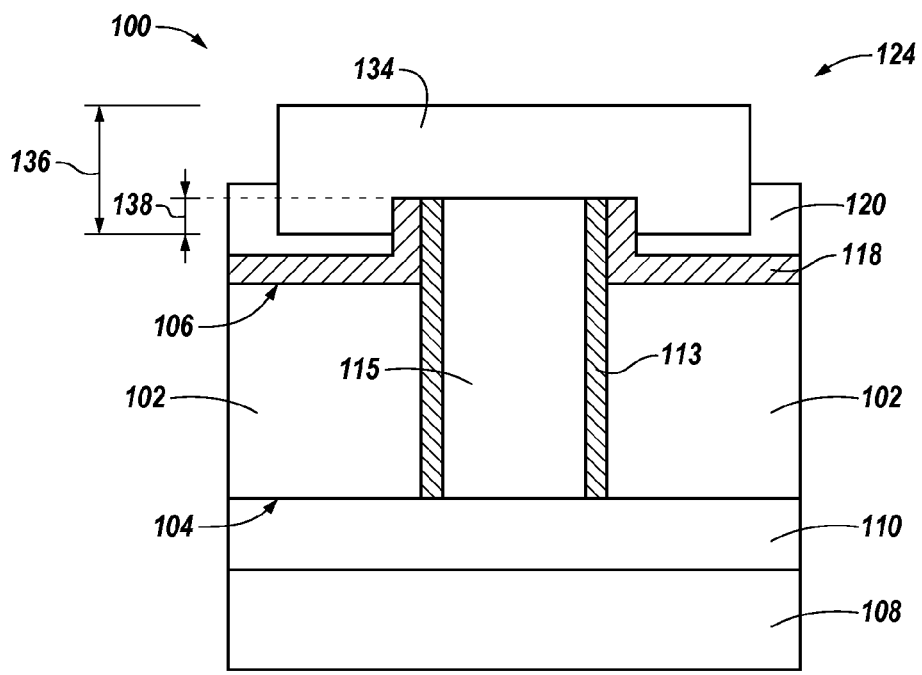

FIG. 1F illustrates the semiconductor device 100 of FIG. 1E at a subsequent processing stage. As illustrated in FIG. 1F, an interconnect 134 can be formed in the opening 124 such that it encapsulates, e.g., surrounds, at least a portion of the TSV protrusion 117. For various applications, the interconnect 134 can be a UBM or a pillar, for example. For instance, a portion of the interconnect 134 can be formed on the lower surface 119 of the opening 124, on sidewalls of the protrusion 117, and on the end surface 121 of the protrusion 117. The interconnect 134 can be formed by a plating process, for example, and can comprise a number of conductive materials, e.g., metals, such as chromium, copper, titanium, nickel, tungsten, and gold, and/or combinations thereof.

In a number of embodiments, the interconnect 134 can be formed on a portion of the liner material 113, a portion of the core material 115, a portion of the dielectric material 118, and a portion of the dielectric material 120. Although not illustrated in FIG. 1F, in a number of embodiments, an interconnect seed material may be formed, e.g., by physical vapor deposition, on a portion of the semiconductor device 100 prior to formation of the interconnect 134. For instance, an interconnect seed material can be formed on, e.g. in contact with, the liner material 113, the core material 115, the dielectric material 118, and/or the dielectric material 120.

As an example, the interconnect can have a height 136 of 20 microns to 300 microns; however, embodiments are not so limited. As shown in FIG. 1F, in a number of embodiments, a portion of the TSV protrusion 117 can extend a distance 138 into the interconnect 134. The distance 138 can be about 10% to 50% of the height 136 of the interconnect 134, for instance. As such, the interconnect 134 encapsulates the TSV protrusion 117 and has an increased contact surface area with the TSV as compared to prior approaches in which the interconnect may only contact an upper surface of a particular TSV. Therefore, the improved adhesion strength and/or improved shear strength provided by the encapsulated TSV protrusion 117 can serve as an anchoring mechanism, which can reduce the likelihood of separation of the interconnect 134 from the TSV 112 during subsequent processing stages, e.g., removal from a dicing tape.

Figure 2A:
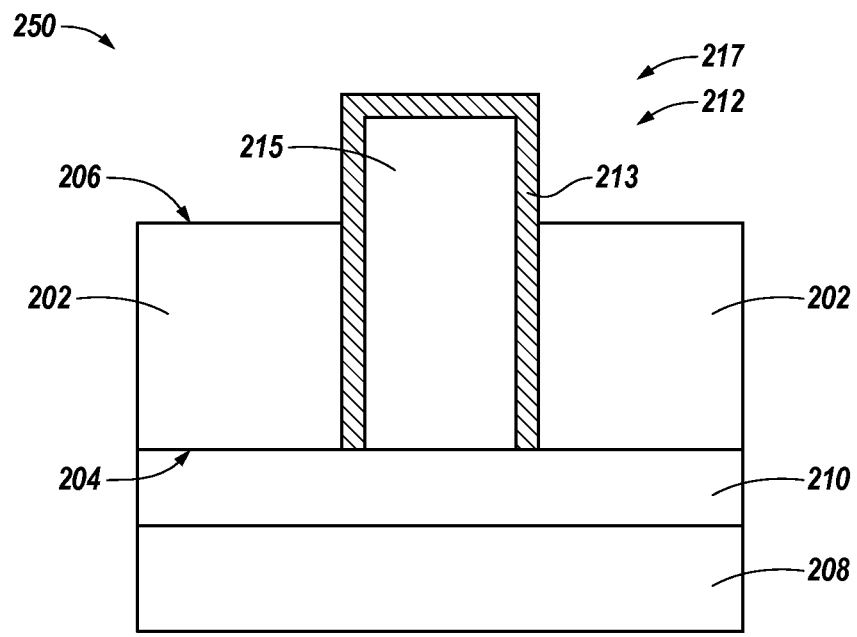
FIGS. 2A-2J illustrate various process stages associated with forming a semiconductor device in accordance with a number of embodiments of the present disclosure.

FIGS. 2A-2F illustrate various process stages associated with forming a semiconductor device in accordance with a number of embodiments of the present disclosure. FIG. 2A illustrates a cross-sectional view of portion of a semiconductor device 250 in accordance with a number of embodiments of the present disclosure. The semiconductor device 250 shown in FIG. 2A includes a TSV 212 formed in a substrate 202. In this example, a first face 204, e.g., front side, of the substrate 202 is adhered to a carrier wafer 208 via a temporary adhesive 210, e.g., a glue material. Although not shown in FIG. 2A, circuitry may be located between the adhesive 210 and coupled to the TSV 212.

As illustrated in FIG. 2A, the TSV 212 extends through the substrate 202, e.g., from the first face 204 to a second face 206, which can be referred to as a backside of the substrate 202. FIG. 2A illustrates device 250 subsequent to a reveal process in which a portion of the substrate material 202 has been removed, e.g., via an etch process, to expose a TSV protrusion 217. While FIG. 2A illustrates a single TSV 212, embodiments of the present disclosure are not so limited. For instance, the semiconductor device 250 can include a plurality of TSVs formed in substrate material 202 and arranged in an array configuration, for example.

In this example, the TSV 212 includes a liner material 213 on a conductive core material 215. The liner material 213 can include a number of materials. As an example, the liner material 213 can include an outer dielectric material, e.g., an oxide barrier material such as SiO (silicon oxide), and an inner conductive material, e.g., a conductive seed material such as Ta (tantalum). However, embodiments are not limited to a particular liner material(s) 213. The core material 215 is a conductive material such as copper, tungsten, and aluminum, and/or combinations thereof, among various other conductive materials. The TSV 212 can provide a conductive path between opposing sides 204/206 of the semiconductor device 250.

Figure 2B:
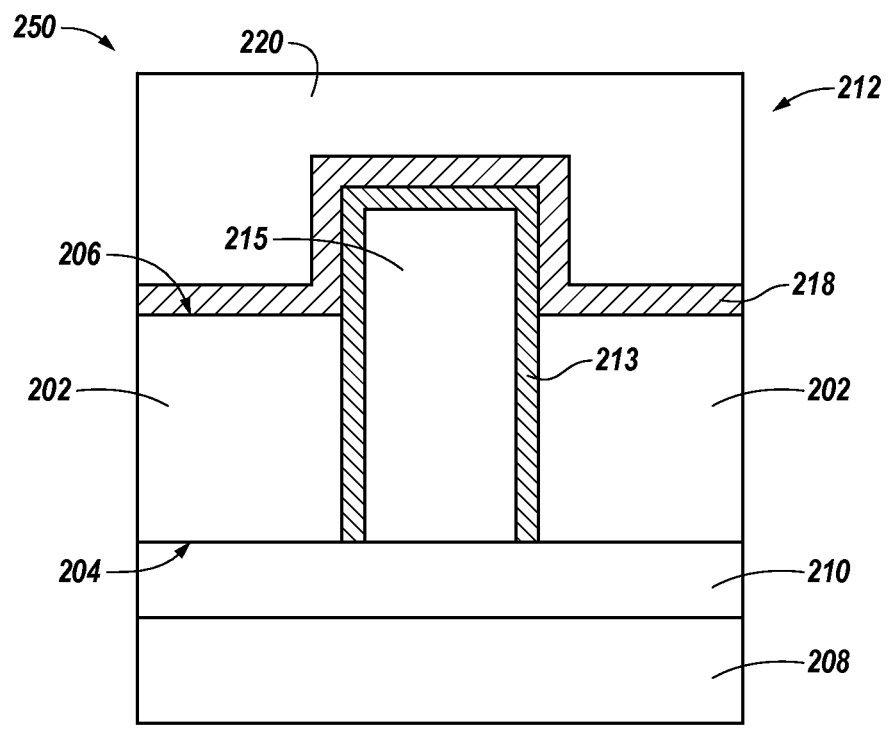

FIG. 2B illustrates the semiconductor device 250 of FIG. 2A at a subsequent processing stage. The example shown in FIG. 2B illustrates the device 250 during a passivation process. In this example, the passivation process includes forming a first dielectric material 218 on the substrate 202 and TSV protrusion 217, and forming a second dielectric material 220 on the first dielectric material 218. As used herein, forming a first material on a second material can, but need not, refer to direct contact between the two materials. As an example, the first dielectric material 218 can be a nitride, e.g., silicon nitride, and the second dielectric material 220 can be an oxide material, e.g., silicon oxide; however, embodiments are not so limited.

Figure 2C:
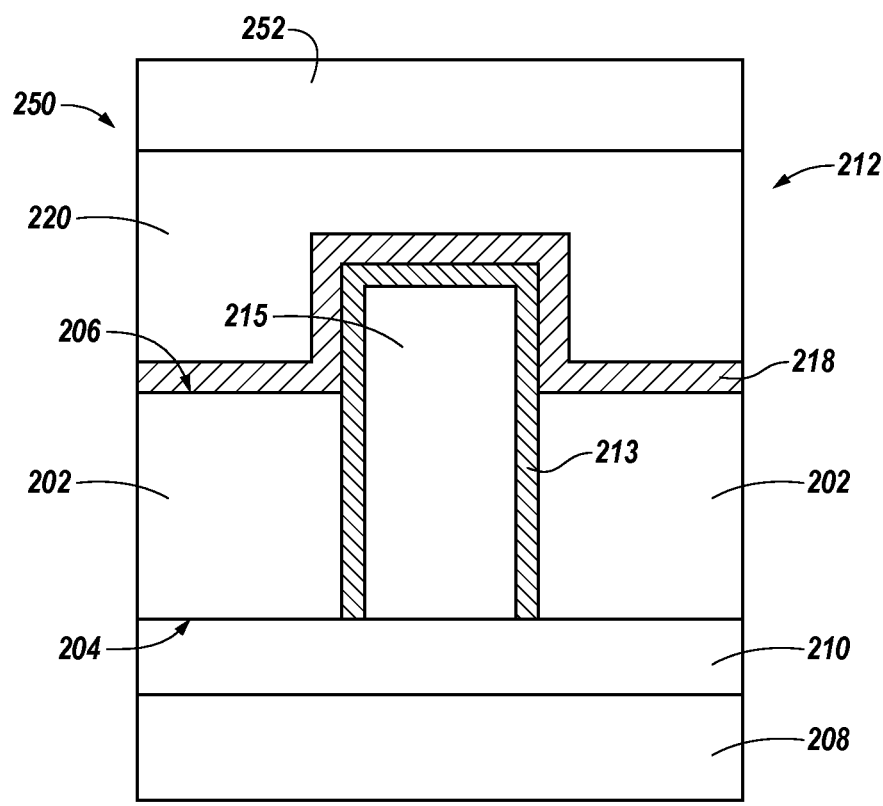

FIG. 2C illustrates the semiconductor device 250 of FIG. 2B at a subsequent processing stage. In this example, a photoresist material 252 is formed on the dielectric material 220. The photoresist material 252 can be developed and etched, as shown in FIG. 2D.

Figure 2D:
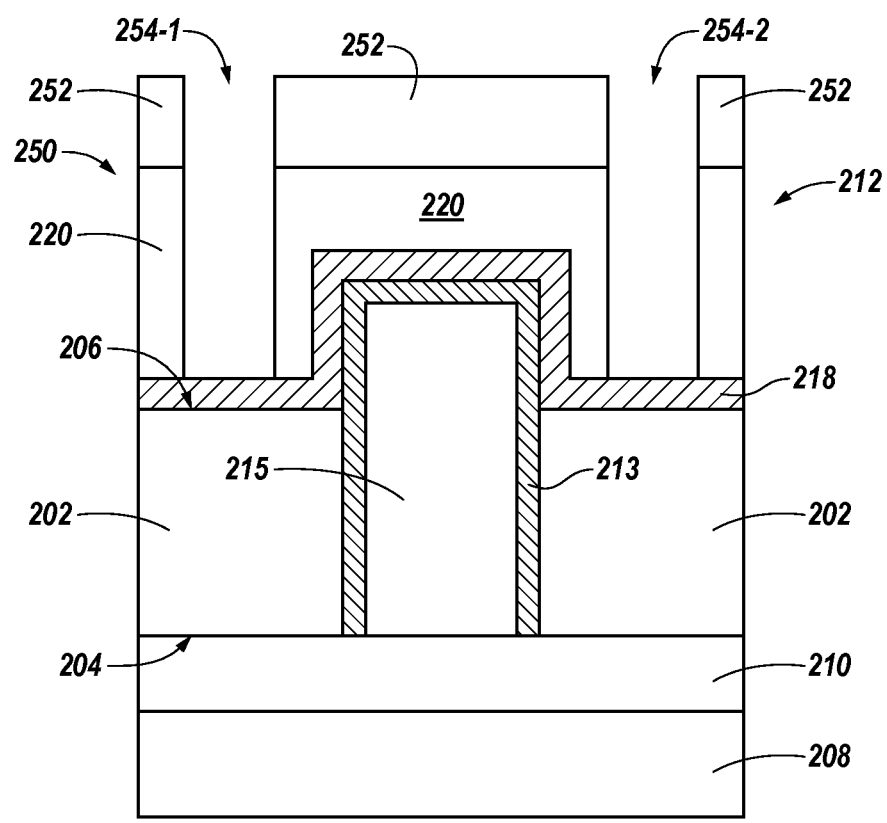

FIG. 2D illustrates the semiconductor device 250 of FIG. 2C at a subsequent processing stage. As illustrated in FIG. 2D, a number of vias 254-1, 254-2 can be formed, e.g., by etching through the dielectric material 220. In this example, the etch through the dielectric material 220 stops on the dielectric material 218. The number of vias 254-1, 254-2 can have differing shapes for various applications. For instance, a particular via, e.g., 254-1 and/or 254-2, may have a circular, square, or triangular cross-sectional shape, among various other cross-sectional shapes.

Figure 2E:
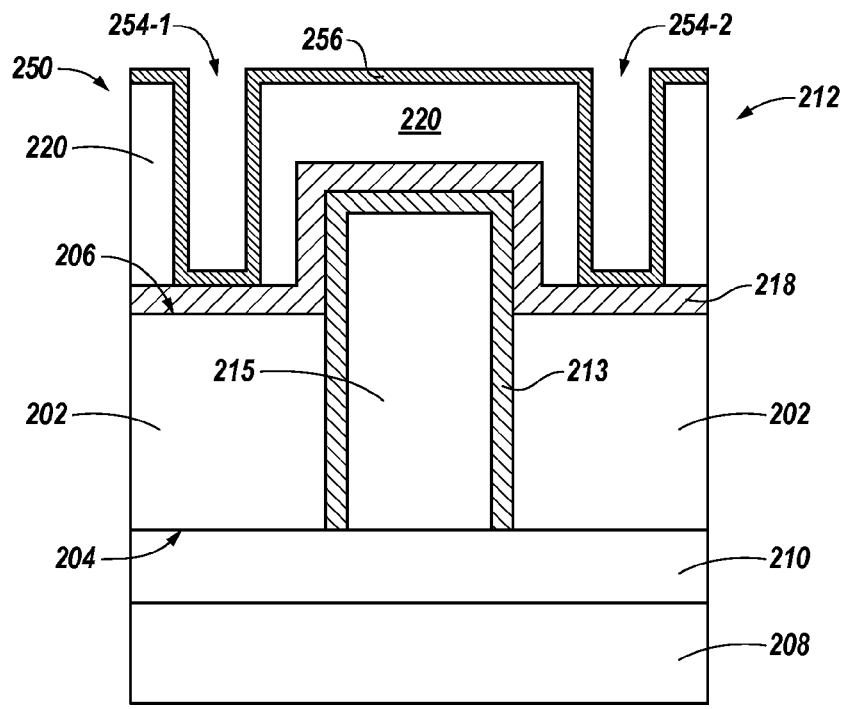

FIG. 2E illustrates the semiconductor device 250 of FIG. 2D at a subsequent processing stage. As illustrated in FIG. 2E, the photoresist 252 material has been removed, e.g. by a stripping process, and a seed material 256 has been formed on the semiconductor device 250. As an example, the seed material 256 can be formed in the vias 254-1/254-2, e.g., on a portion of the dielectric material 218, and on a portion of the dielectric material 220. Examples of the seed material 256 include copper, tungsten, and aluminum, among others.

Figure 2F:
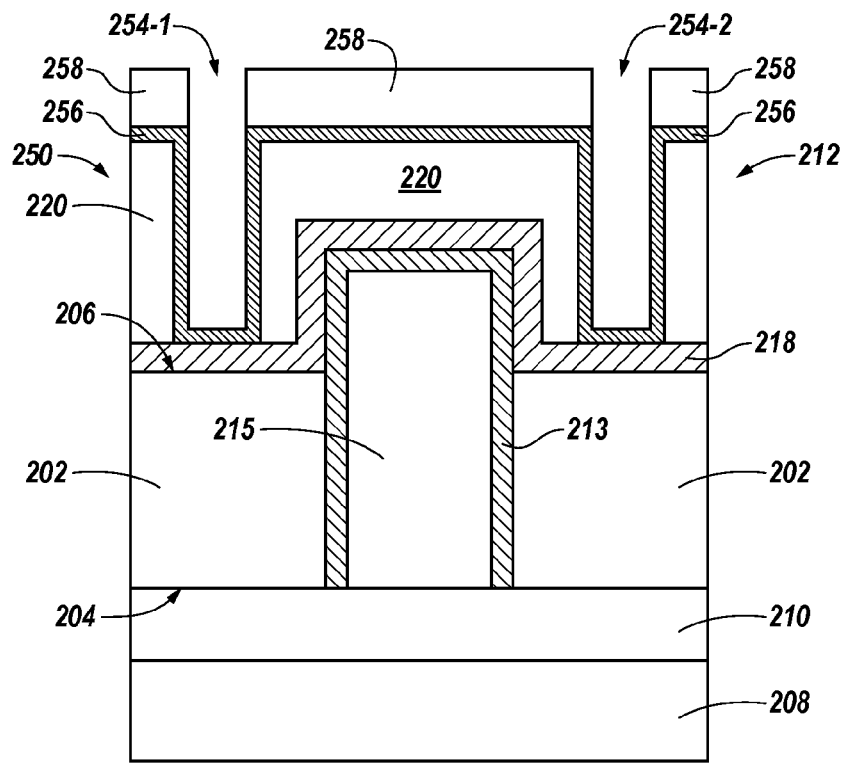

FIG. 2F illustrates the semiconductor device 250 of FIG. 2E at a subsequent processing stage. A subsequent photoresist material 258 can be formed on a portion of the semiconductor device 250, e.g., on portions of the seed material 256, as illustrated in FIG. 2F.

Figure 2G:
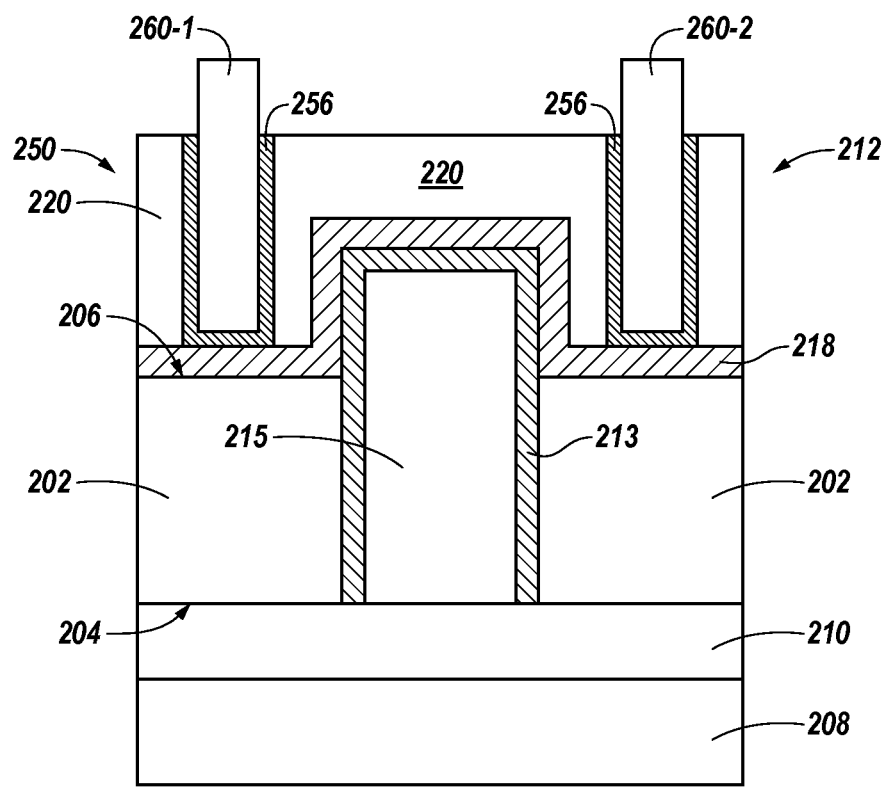

FIG. 2G illustrates the semiconductor device 250 of FIG. 2F at a subsequent processing stage. As illustrated in FIG. 2G, a conductive material can be formed in the vias 254-1 and 254-2 resulting in conductive plugs 260-1 and 260-2, respectively. The conductive plugs 260-1, 260-2 can be formed of copper, tungsten, and aluminum, and/or other conductive materials and/or combinations thereof. As discussed further herein, the conductive plugs 260-1, 260-2 can provide improved adhesion of a subsequently formed interconnect to the semiconductor device 250, as compared to adhesion characteristics of previous semiconductor devices.

As illustrated in FIG. 2G, the photoresist 258 has been removed, e.g., by a stripping process. Additionally, portions of the seed material 256, such as portions of the seed material 256 not within vias 254-1 and 245-2, are removed, e.g., via an etch process.

Figure 2H:
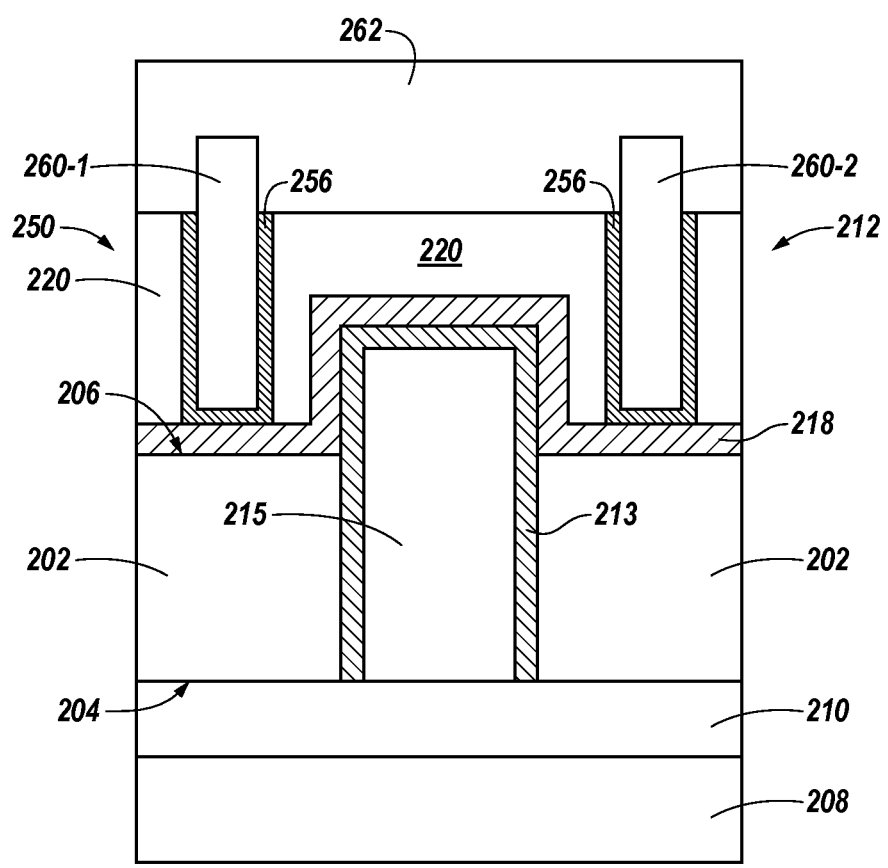

FIG. 2H illustrates the semiconductor device 250 of FIG. 2G at a subsequent processing stage. As illustrated in FIG. 2G, a dielectric material 262 can be formed on a portion of the semiconductor device 250. For instance, the dielectric material 262 can be formed on the dielectric material 220 and on the conductive plugs 260-1 and 260-2. The dielectric material 262 can be tetraethyl orthosilicate (TEOS), for example.

Figure 2I:
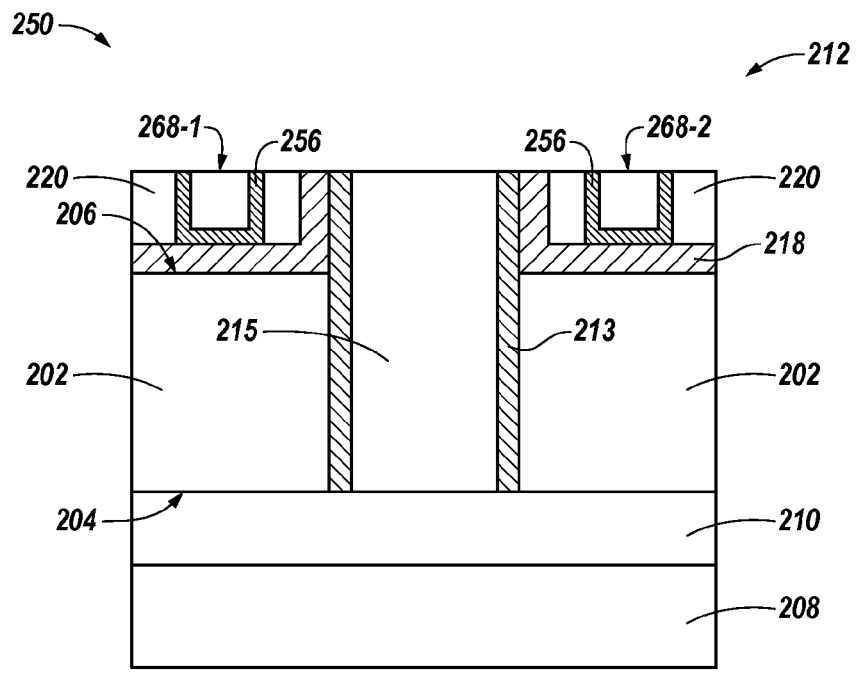

FIG. 2I illustrates the semiconductor device 250 of FIG. 2H at a subsequent processing stage. FIG. 2I illustrates the device 250 subsequent to a planarization process used to expose a surface 266 of the TSV 212. As shown, the planarization process involves removing a portion of the dielectric material 262, a portion the dielectric material 220, a portion the conductive plugs 260-1 and 260-2, a portion the dielectric material 218, and a portion of the TSV 212. Subsequent to the planarization process, exposed surfaces 268-1 and 268-2 of the respective conductive plugs 260-1 and 260-2 are at a same level as the exposed surface 266 of the TSV 212.

Figure 2J:
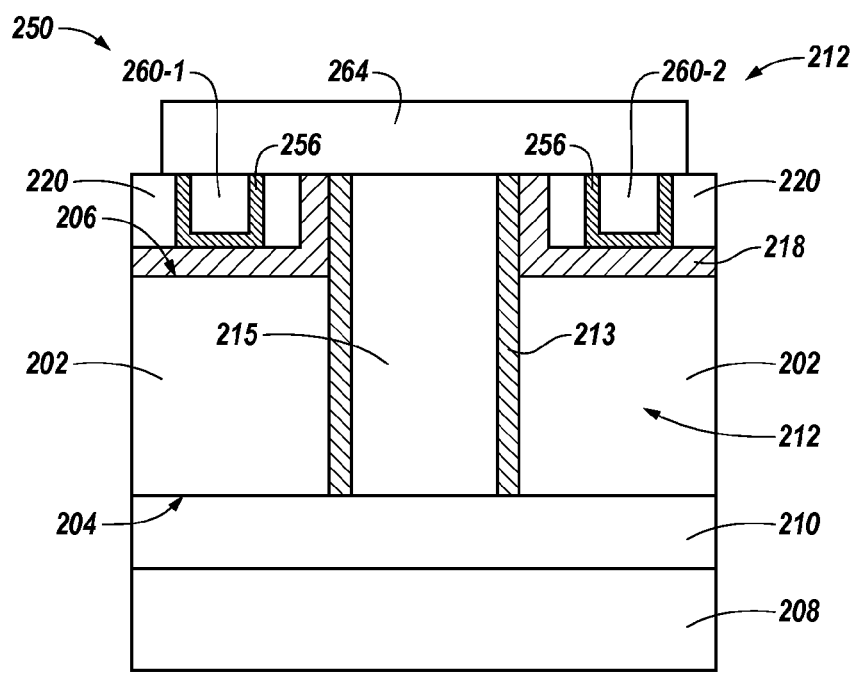

FIG. 2J illustrates the semiconductor device 250 of FIG. 2I at a subsequent processing stage. As illustrated in FIG. 2J, an interconnect 264 can be formed on the semiconductor device 250. For various applications, the interconnect 264 can be a UBM or a pillar, for example. The interconnect 264 may be formed on the number of conductive plugs 260-1, 260-2 and the exposed surface 266 of the TSV 212. Embodiments of the present disclosure provide that both the number of conductive plugs 260-1, 260-2 and the exposed surface 266 can provide conductive contact surfaces to which the interconnect 264 can adhere. As such, the contact surface between the plugs 260-1/260-2 and the interconnect 264 provide an increased adhesion surface, and thus increased anchoring, as compared to prior approaches which may only provide an adhesion surface between the TSV 212 and the interconnect 264. The plugs 260-1 and 260-2 may be referred to as "dummy conductive plugs" because they are not used to provide an active conductive path between elements. Additionally, the conductive plugs 260-1, 260-2 may facilitate heat transfer associated with the semiconductor device 250.

The contact area between one of the number of conductive plugs 260-1 and 260-2 and the interconnect 264 can be about 20 square microns to 500 square microns, for instance.

While two conductive plugs 260-1, 260-2 are illustrated and associated with a single interconnect 264, embodiments of the present disclosure are not so limited. For example, more or fewer than two conductive plugs may be associated with a single interconnect. Also, a particular conductive plug may be associated with a plurality of interconnects.

Because the interconnect 264 is formed both on the exposed surface 266 of the TSV 212 and the conductive plugs 260-1, 260-2, the interconnect 264 can have improved adhesion to the semiconductor device 250, as compared to other semiconductor devices. Advantageously, this improved adhesion can provide for reduced inadvertent interconnect displacement, such as interconnect displacement that can occur during separation of a semiconductor device, e.g., 250, from a dicing tape, for example.

Figure 3:
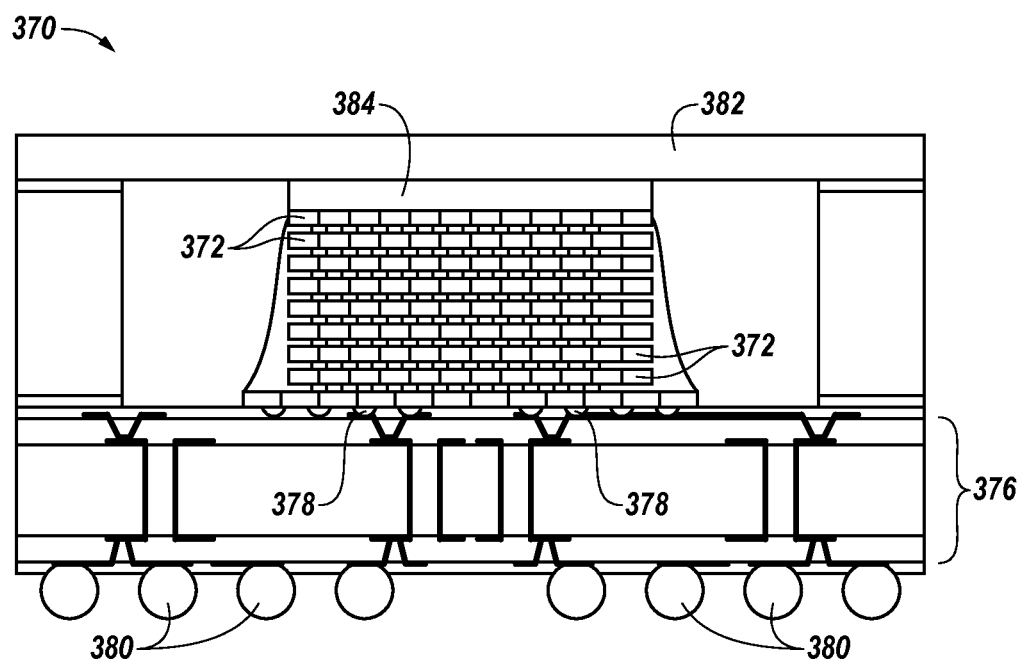
FIG. 3 illustrates a portion of a system in accordance with a number of embodiments of the present disclosure.

FIG. 3 illustrates a portion of a system 370 in accordance with a number of embodiments of the present disclosure. The system 370 can include a number of semiconductor devices 372. The semiconductor devices 372 can be semiconductor devices such as those discussed herein, e.g., semiconductor devices 100 and/or semiconductor devices 250. As known to those skilled in the art, the number semiconductor devices 372 may include various types of semiconductor components and functional features, such as dynamic random-access memory (DRAM), static random-access memory (SRAM), flash memory, other forms of integrated circuit memory, processing circuits, imaging components, and/or other semiconductor features. In some embodiments, for example, the system 370 can be configured as a hybrid memory cube (HMC) in which the stacked semiconductor devices 372 are DRAM dies or other memory dies that provide data storage.

As illustrated in FIG. 3, the number semiconductor devices 372 can be interconnected, e.g., stacked and electrically coupled, through a number of TSVs as discussed herein, to one another and/or other components of the system 370, for example. The number semiconductor devices 372 may be stacked over a semiconductor logic die 374. The semiconductor logic die 374 may be a processor, such as an application specific integrated circuit (ASIC) processor or a central processing unit (CPU) processor.

The number semiconductor devices 372 may be electrically coupled to the semiconductor logic die 374 by a number of TSVs, for example. The semiconductor logic die 374 may be electrically coupled to a printed circuit board (PCB) 376 through, for example, a number of conductive structures 378. The PCB 376 may include a number of conductive structures 380 for electrically coupling the PCB 376 to a higher level substrate, such as a mother board, for example.

The system 370 may include a heat sink 382, e.g., a conductive plate may be positioned over the stack of semiconductor devices 372 to draw heat away from the semiconductor devices 372 and/or the semiconductor logic die 374. A thermal interface material (TIM) 384 may be utilized to improve heat transfer, for instance.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A semiconductor device, comprising:
   a substrate material;
   a through-silicon-via protrusion extending from the substrate material;
   a first dielectric material formed on the substrate material;
   a second dielectric material formed on the first dielectric material; and
   an interconnect formed on the through-silicon-via protrusion such that the interconnect is in contact with at least a portion of the through-silicon-via protrusion, wherein the interconnect is formed in an opening in the second dielectric material, and wherein:
   at least one sidewall of the interconnect extends from within the opening to a location above a planarized surface of the second dielectric material, such that the at least one sidewall extends below the planarized surface of the second dielectric material and an upper surface of the through-silicon-via protrusion; and
   the second dielectric material is an uppermost dielectric material among dielectric materials formed on the substrate.

2. The semiconductor device of claim 1, wherein the opening encompasses the through-silicon-via protrusion.

3. The semiconductor device of claim 1, wherein the through-silicon-via protrusion extends beyond a lower surface of the opening.

4. The semiconductor device of claim 3, wherein an end surface of the through-silicon-via protrusion is located between a plane formed by the lower surface of the opening and a plane formed by the planarized surface of the second dielectric material.

5. The semiconductor device of claim 4, wherein the interconnect encapsulates at least a portion of the through-silicon-via protrusion.

6. The semiconductor device of claim 1, wherein the first dielectric material is a nitride material.

7. The semiconductor device of claim 1, wherein the second dielectric material is an oxide material.

8. A method of forming a semiconductor device, the method comprising:
   exposing a through-silicon-via protrusion by removing a portion of a substrate material;
   forming a first dielectric material on the through-silicon-via protrusion;
   forming second dielectric material on the first dielectric material;
   performing a planarization process to expose a first surface of the through-silicon-via protrusion;
   forming an opening in the second dielectric material, wherein a lower surface of the opening extends below the exposed first surface of the through-silicon-via protrusion; and
   forming an interconnect in the opening such that the interconnect encapsulates at least portion of the through-silicon-via protrusion and at least one sidewall of the interconnect extends from within the opening to a location above a planarized surface of the second dielectric material, wherein:
   the at least one sidewall extends below the planarized surface of the second dielectric material and an upper surface of the through-silicon-via protrusion; and
   the second dielectric material is an uppermost dielectric material among dielectric materials formed on the substrate.

9. The method of claim 8, wherein forming the interconnect includes forming the interconnect on the exposed first surface of the through-silicon-via protrusion.

10. The method of claim 9 wherein a portion of the interconnect is formed below the exposed first surface of the through-silicon-via protrusion.

11. The method of claim 9, wherein forming the interconnect includes forming the interconnect on the lower surface of the opening.

* * * * *